United States Patent [19]

Cathey, Jr.

[11] Patent Number: 5,344,525

[45] Date of Patent: Sep. 6, 1994

[54] PROCESS FOR ETCHING SEMICONDUCTOR DEVICES

[75] Inventor: David A. Cathey, Jr., Boise, Id.

[73] Assignee: Micron Technology, Inc., Boise, Id.

[21] Appl. No.: 996,480

[22] Filed: Dec. 23, 1992

Related U.S. Application Data

[63] Continuation of Ser. No. 647,263, Jan. 29, 1991, abandoned.

[51] Int. Cl.⁵ ............................................. H01L 21/00
[52] U.S. Cl. .................................. 156/643; 156/664; 156/666; 156/345
[58] Field of Search ................ 156/643, 664, 666, 345

[56] References Cited

U.S. PATENT DOCUMENTS

| | | | |
|---|---|---|---|
| 4,468,284 | 8/1984 | Nelson | 156/643 |
| 4,545,851 | 1/1985 | Takada | 156/345 |
| 4,687,544 | 8/1987 | Bersin | 156/345 |
| 4,931,410 | 6/1990 | Tokunaga et al. | 437/189 |
| 4,971,653 | 11/1990 | Powell et al. | 156/345 |

FOREIGN PATENT DOCUMENTS

| | | |
|---|---|---|
| 58-117358 | 2/1983 | Japan . |
| 60-249328 | 12/1985 | Japan . |
| 02239620 | 9/1990 | Japan . |
| 04099290 | 3/1992 | Japan . |
| 04316327 | 11/1992 | Japan . |
| 05006876 | 1/1993 | Japan . |

OTHER PUBLICATIONS

"Plasma Etching In Semiconductor Fabrication" ed. by Russ A. Morgan; ©1985; N.Y., N.Y.; pp. 98–99 and 42–43.

Primary Examiner—R. Bruce Breneman
Assistant Examiner—George Goudreau
Attorney, Agent, or Firm—Lia M. Pappas

[57] ABSTRACT

A process for etching a semiconductor device having a plurality of layers to form a predetermined etched pattern therein is provided. At least one of the layers of the semiconductor device comprise a layer formed of a low reactivity material. A low reactivity material is one which, when chemically reacted with an chemical etchant material, typically in gas phase, at a temperature of up to about 200 degrees C., does not form a substantial amount of volatile by-products from the chemical reaction. The temperature of the low reactivity material layer is therefore elevated, generally in a controllable and uniform manner, to a level which, upon reaction with the chemical etchant material in gas phase, will form a substantial amount of volatile gaseous by-products from the chemical reaction. Then, the semiconductor device is etched with an etchant material to form a predetermined pattern therein. In this way, the chemical etching reaction produces a substantial amount of volatile gaseous by-products. Since a substantial amount of volatile gaseous by-products is formed, the gaseous material can be readily removed from the etching area.

23 Claims, 1 Drawing Sheet

PROCESS FOR ETCHING SEMICONDUCTOR DEVICES

This application is a continuation of U.S. Ser. No. 07/647,263 which was filed on Jan. 29, 1991 and is now abandoned.

BACKGROUND OF THE INVENTION

This invention relates to a process for etching semiconductor devices, and more particularly to a process for effectively and efficiently etching multi-layer semiconductor devices while maintaining intact the electrical characteristics of these devices.

It is known in the prior art that the manufacture of multi-layer semiconductor devices typically involves patterned etching using liquid or wet etching materials, or dry etching with halogens or halogen-containing compounds, of certain layers which comprise features these devices. For example, one well known etching material is chlorine which can exist in the etching process as either chlorine gas or HCl, etc. Chlorine etches the semiconductor isotropically, i.e., in both a lateral and vertical direction. This results in an etched feature which has a line width which is smaller than the resist image.

Etching can also be conducted in a gas phase using known techniques such as plasma etching, ion beam etching, and reactive ion etching. The use of gas plasma technology provides substantially anisotropic etching using gaseous ions, typically generated by an RF discharge. In gas plasma etching the requisite portion of the surface to be etched is removed by a chemical reaction between the gaseous ions and the subject surface. In the anisotropic process, etching takes place only or primarily in the vertical direction so that feature widths substantially match the photoresist pattern widths.

Although there are many plasma processing modes, as hereinafter described, the two systems that dominate the semiconductor plasma etch field are plasma etching (PE) and reactive ion etching (RIE). For example, in FIG. 1, the major components of a parallel-plate plasma etching system a typical gas plasma etching system 10 are pictorially depicted. The gas plasma etching system 10 includes a gas plasma etching chamber 12 into which a semiconductor device 14 is introduced. An etchant gas mixture is introduced into etching chamber 12 through a gas inlet, described by directional arrow 16, for use in the gas plasma etching of the semiconductor device 14. The chemical species in the plasma are determined by the source gas(es) use. Semiconductor device 14 is located between upper and lower plasma etching electrode plates 22 and 24, respectively. The upper plate 22 is grounded at 26. The lower plate 24 is connected to an RF generator 28 which supplies energy for creating a gas plasma from the etchant gas via the collisions between electrons and gas molecules. It is this gas plasma which etches, preferably anisotropically, semiconductor device 14.

In the plasma etching mode, the electrode areas are symmetrical, and the DC voltage between the plasma and either electrode is substantially the same and relatively small. The various ions and free radicals that are generated in the gas plasma diffuse to the electrode and wafer surfaces where they can react with the material being etched. It is this gas plasma material which anisotropically etches semiconductor device 14 forming a reactive chemical compound. The reaction of the gas plasma with the semiconductor device 14 during a conventional gas plasma etching process forms volatile gaseous by-products. These by-products must be removed from the surface of semiconductor device 14 so that further reaction at the etching site, during the etching process is not inhibited. In order to effectively and efficiently conduct this etching process, volatilization and removal of the volatile by-product must occur. Thus, after the etching operation is completed, substantially all of these volatile gaseous by-products, and any residual etchant gas which may be present, are removed from within the chamber 12 via exhaust system 18. Exhaust system 18 includes an exhaust pump 20.

However, when the above-described plasma etch technology is employed to pattern certain materials which form the various semiconductor layers problems occur. This is because the by-products formed by the plasma etch chemical reaction on the surface of these materials are nonvolatile and cannot be readily removed from these surfaces using conventional plasma etch technology. Many materials, such as copper and cobalt, are therefore not considered for use in VLSI semiconductor fabrication because they do not chemically react to form volatile gaseous by-products. Copper, for example, because of its low resistivity and high level of ductility, would be a highly desirable VLSI semiconductor material, if not for the low volatility of its reaction by-product, particularly its reactive halide by-product.

Therefore, a need exists for a vapor phase etch technology for use with materials which do not readily form volatile gaseous by-products in conventional plasma etching, so that the chemical etching reaction will instead form volatile gaseous by-products which can be readily removed from the surface of the semiconductor device in the vapor phase etching area. The presence of these non-volatile by-product materials on the surface of the semiconductor device inhibits the etching reaction between the etchant gas and the semiconductor device.

SUMMARY OF THE INVENTION

The process of the present invention meets the above-described existing needs by providing a method and a system in which the by-products on the surface of a semiconductor device, which are nonvolatile under normal etching conditions, are volatilized so that they can be readily removed from the etching area without inhibiting the etching of the semiconductor device.

Thus, a process for etching a semiconductor device to form a predetermined etched pattern therein in which a semiconductor device having a plurality of layers is provided in an etching area. At least one of the layers of the semiconductor device comprise a layer formed of a low reactivity material. A low reactivity material is one which, when chemically reacted with an chemical etchant material, typically in gas phase, at a temperature of up to about 200 degrees C., does not form a substantial amount of volatile by-products from the chemical reaction. These materials are not generally used in semiconductor devices because of this processing limitation. However, in the process of the subject invention, this limitation has been overcome.

More specifically, auxiliary heating of the semiconductor device has been introduced prior to conducting the etching step. The temperature of the low reactivity material layer is therefore elevated, generally in a controllable and uniform manner, to a level which, upon reaction with the chemical etchant material in gas phase, will form a substantial amount of volatile gaseous by-products from the chemical reaction. Then, the semiconductor device is etched with an etchant material to form a predetermined pattern therein. In this way, the chemical etching reaction produces a substantial amount of volatile gaseous by-products. Since a substantial amount of volatile gaseous by-products is formed, the gaseous material can be readily removed from the etching area.

The heating of the semiconductor device can be accomplished in several ways. In one approach, the controlled, uniform elevation of the temperature of the semiconductor device comprises heating one or both sides of the semiconductor device. More particularly, the temperature elevation process preferably includes the step of positioning the semiconductor device in an etching work area, and controllably and uniformly elevating the temperature of the semiconductor device by heating the underside thereof. This is preferably accomplished by providing a foraminous substrate for supporting the semiconductor device within the etching work area. The foraminous substrate has at least one opening for introducing heat there through, and preferably has a plurality of such openings. More specifically, the process of the present invention can further include the steps of providing means located below the foraminous substrate for elevating the temperature of the semiconductor device; positioning the semiconductor device on the foraminous substrate; and elevating the temperature of the semiconductor device by introducing heat through the foraminous substrate from the means for elevating the temperature of the semiconductor device. In one form of this invention, the foraminous substrate comprises an electrode defining at least one opening for introducing the heat through the opening in the foraminous substrate to the semiconductor device.

The non-reactive material generally comprises a metal-containing material The preferred metal-containing material comprises copper and cobalt, although copper is most preferred.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
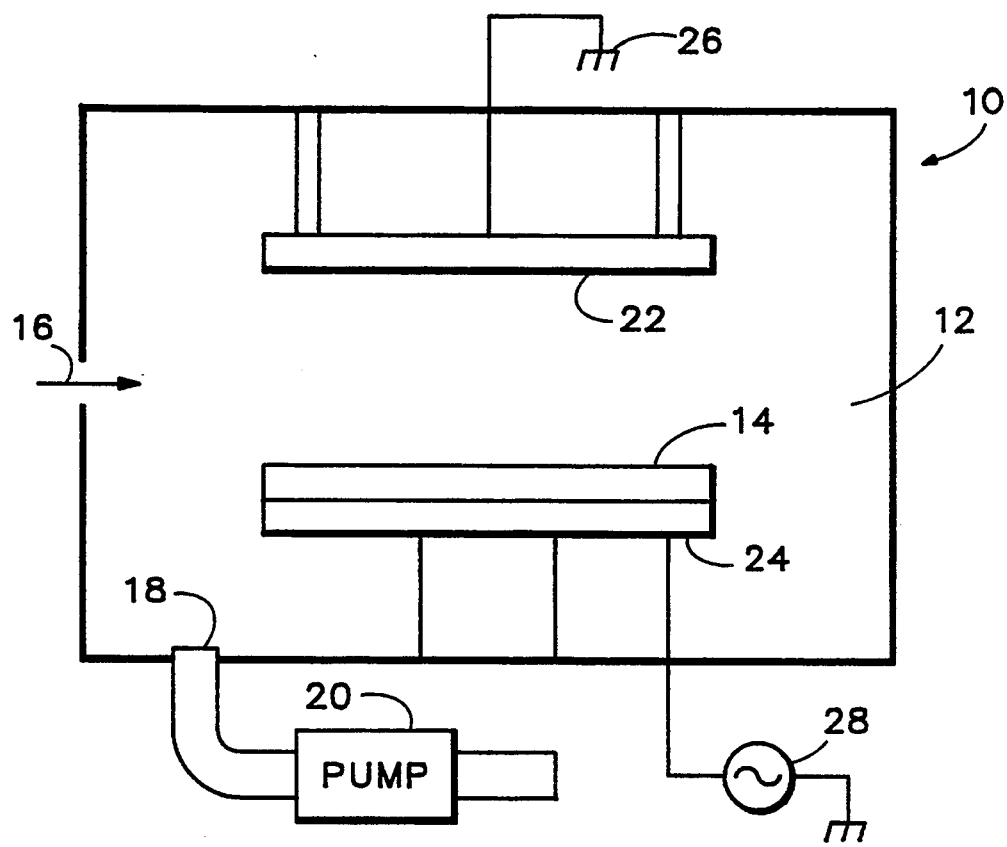
FIG. 1 is a pictorial representation of a typical prior art plasma etching system.
Figure 2:
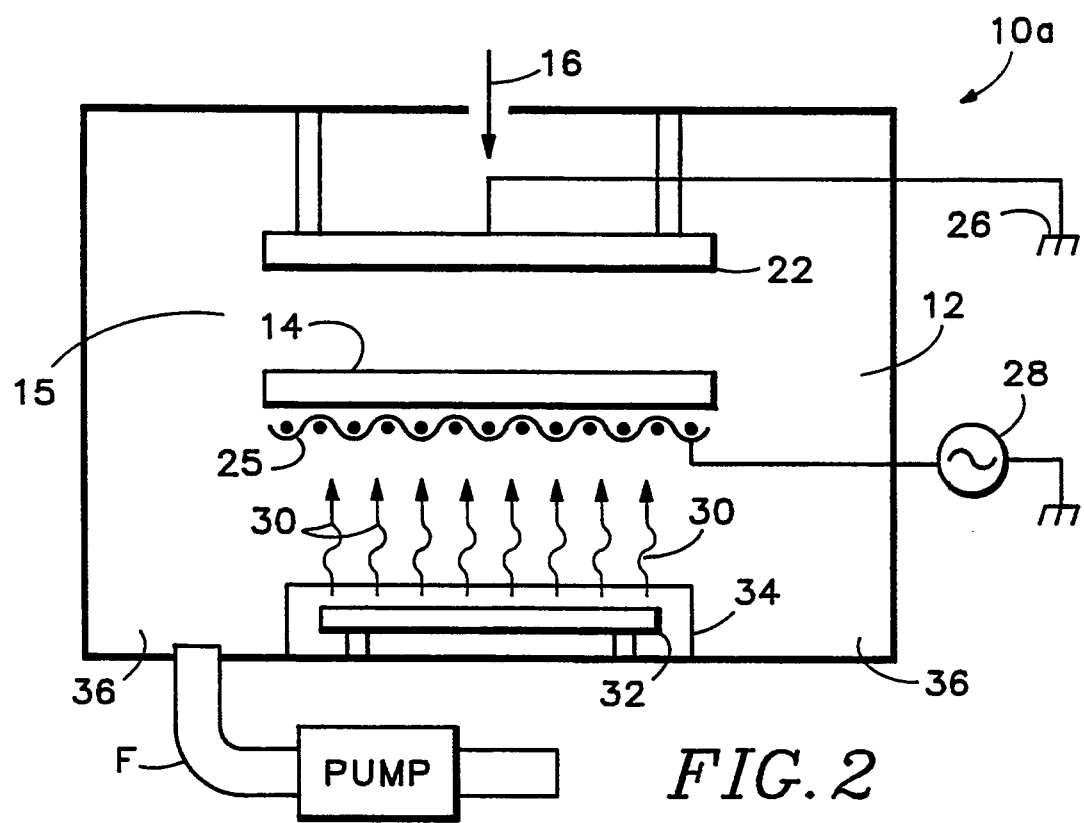
FIG. 2 is a pictorial representation of a preferred etching system of the present invention.

Referring now to FIG. 2, the inventive process of the present invention is generally directed to etching semiconductor devices, such as semiconductor device 14, which include at least one layer formed of a low reactivity material in etching chamber 12. The conventional gas plasma etching system shown in FIG. 1 cannot effectively etch semiconductor device 14. The reason for this is because the etchant chemicals do not form a substantial amount of volatile by-products during the chemical etching reaction, at temperatures up to 200 degrees C., so that they can be readily removed from the etching chamber 12.

In the process of the present invention, the etching of semiconductor device 14 is conducted in an etching area, in this case within the confines of etching chamber 12'. Chamber 12' is similar in design to the etching chamber of FIG. 1, except that etching of semiconductor devices is conducted under conditions in which the temperature of semiconductor device 14 is elevated, in a controlled and uniform manner, to effect the formation of volatile by-products during the etching process. This temperature increase occurs while at the same time maintaining the application of RF power and electrical bias to the semiconductor device 14. The gas plasma etch technique employed herein typically is generated under vacuum within the confines of etching chamber 12'. The preferred plasma etch technique may include the use of ECR, MCR, MIE, electro cyclotron resonance, PE reactive ion, point plasma etching, or magnetically confined PE patterning of the materials in the semiconductor device 14.

An etchant gas is then introduced into etching chamber 12' through a gas inlet, as described by directional arrows 16, for use in the gas plasma etching of the semiconductor device 14. The chemical species in the gas plasma are determined by the source gas(es) used which are hereinafter described.

A pair of parallel plasma etching electrodes in the form of upper solid plate 22 and lower foraminous member 25 are disposed within the confines of etching chamber 12'. Upper electrode plate 22 of FIG. 2 is similar in design to upper electrode plate 22 of FIG. 1 in both design and function. Semiconductor device 14 is located between upper electrode plate 22 and lower foraminous member 25, respectively, and is supported on foraminous member 25. The upper plate 22 is grounded at 26. The foraminous member 25 is connected to an RF generator 28 of similar design and construction to an RF generator 28 similar to the one employed in the system depicted in FIG. 1. As before, RF generator 28, under the influence of vacuum, supplies energy to the foraminous member 25 for creating a gas plasma material from the etchant gas. It is this gas plasma material which forms a reactive chemical compound for anisotropically etching semiconductor device 14.

In addition to functioning as a plasma etch electrode, electrode plate 25 is designed to facilitate a controlled and uniform elevation of the temperature of semiconductor 14. Foraminous member 25 comprises a support member which defines at least one opening through which heat energy can pass for purposes of raising the temperature of a semiconductor device 14 located on foraminous member 25. It is preferred, however, that foraminous member 25 include a plurality of such openings 25, as depicted in FIG. 2, to effect the increase in temperature of semiconductor device 14 in a more controlled and uniform manner. Typically, a mesh or grid-like plasma electrode plate can be employed for use as foraminous member 25.

The source of heating energy for elevating the temperature of the semiconductor 14 is generally located underneath the foraminous member 25. In this way, the heating energy (see direction arrows 30) will pass through the openings 25 in the foraminous member 25 and elevate the temperature of the semiconductor device 14. Heating energy can be provided by a number of different types of heating sources, particularly radiative heating sources. For example, the heating source can be a halogen quartz lamp. As shown in FIG. 2, the heating source 32 is disposed within a quartz window 34 attached to the inner bottom surface 36 of etching chamber 12.

In the plasma etching mode, as previously described with respect to the conventional system of FIG. 1, the various ions and free radicals that are generated in the gas plasma diffuse to the electrodes, plate 22 and foraminous member 25, and to the surfaces of semiconductor device 14 where they can react and anisotropically etch semiconductor device 14 forming a reactive chemical compound. It is this reaction of the gas plasma with the device 14 during a conventional gas plasma etching process that forms the volatile by-products which must be removed from the surface of device 14 so that it does not inhibit the etching process. Thus, as in the system of FIG. 1, after the etching operation is completed, substantially all of these volatile by-products produced herein, and any residual etchant gas which may be present, are removed from within the chamber 12' via exhaust system 18. Exhaust system 18 includes an exhaust pump 20.

This invention is directed to a process for etching a semiconductor device 14 to form a predetermined etched pattern therein. The semiconductor device employed generally has a plurality of layers, at least one of the layers preferably comprising a metal-containing layer. Typically, semiconductor device 14 comprises a plurality of layers, including at least one layer of a low reactivity material. Furthermore, at least one of the low reactivity layers of the semiconductor device preferably comprises a metal-containing material.

The low reactivity material used in producing the semiconductor device 14 is characterized in that when it is chemically reacted with an chemical etchant material in gas phase, it does not form a substantial amount of volatile by-products from that chemical reaction at temperatures up to about 200 degrees C. For example, in etching a semiconductor device, having $SiO_2$ and copper layers, with an etchant material comprising a halide or a halogen gas, such as chlorine gas, copper chloride is formed on the surface of the copper layer. The copper chloride by-products must be removed from the surface of device 14 so that the etching process can continue until it has reached completion. However, at the temperatures at which etching operations are typically conducted, i.e., temperatures less than about 200 degrees C., the copper chloride will not volatilize at any appreciable rate so that it can be readily removed from within the etching chamber. If, however, the temperature in the etching chamber is raised above 300 degrees C. as per the process of the present invention, gaseous copper chloride is formed within the confines of the etching chamber which can then be readily removed according the method set forth in FIG. 2. Preferably, the vapor pressure of the by-products produced during etching is at least about 0.2 Torr at an etching temperature of at least about 200 degrees C.

Particular materials which are characterized as low reactivity materials include metal-containing materials, particularly, metal-containing materials. Preferred low reactivity materials include metal-containing materials such as copper and cobalt. The metal-containing material of the metal-containing layer can also comprise materials which form substantial amounts of volatile by-products during the etching reaction. These materials include aluminum, molybdenum, titanium, tungsten, and aluminum alloys. The aluminum alloys are typically include aluminum in combination with any one or all of titanium, tungsten, molybdenum, titanium-tungsten, and silicon.

The semiconductor device located within the etching area is then etched with an etchant material to form a predetermined pattern therein. The chemical etchant composition and the coating composition are in a substantially gas phase during the etching of the semiconductor device. Coating material is deposited onto the entire outer surface of the semiconductor, but is removed from the horizontal surfaces by ionic bombardment of the gas phase etchant material.

The chemical etchant composition can be selected from any material which will chemically etch the semiconductor device 14. However, because of its excellent etching characteristics and its low cost, a halogen-containing material, and preferably HCl or chlorine gas, is preferably employed as the chemical etchant composition.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A process for etching a semiconductor device to form an etched pattern therein, comprising:
    providing in a etching area, a semiconductor device having a plurality of layers, at least one of said layers of said semiconductor device comprising a layer formed of a first material which, when chemically reacted with a chemical etchant in gas phase, at a temperature of up to about 200 degrees C., forms nonvolatile by-products from said chemical reaction, the presence of said nonvolatile gaseous by-products inhibiting the etching of the semiconductor device;
    elevating the temperature of each said layer of said first material to a level which, upon reaction with said chemical etchant, forms volatile gaseous by-products from said chemical reaction;
    anisotropically etching said semiconductor device with said chemical etchant, at said elevated temperature, to form a pattern therein, said etching of said semiconductor device producing said volatile gaseous by-products and said nonvolatile gaseous by-products which does not inhibit the effective etching of said semiconductor device;
    removing said gaseous volatile by-products from said etching area; and
    providing a foraminous member for supporting said semiconductor device within said etching work area, said foraminous member being unreactive with said semiconductor device and remaining intact at said elevated temperature.

2. The process of claim 1, wherein said first material comprises a metal.

3. The process of claim 2, wherein said elevated temperature is in the range of 300 degrees C.

4. The process of claim 2, wherein said metal-containing material comprises copper.

5. The process of claim 1, which further includes the step of providing means located below said foraminous member for elevating the temperature of said semiconductor device; positioning said semiconductor device on said foraminous member; and elevating the temperature of said semiconductor device by introducing heat through said foraminous member from said means for elevating the temperature of said semiconductor device.

6. The process of claim 1, which further includes the step of positioning said semiconductor device in an etching work area, and elevating the temperature of said semiconductor device by heating the underside thereof.

7. The process of claim 1, which further includes the step of applying at least one of RF power and electrical bias to the semiconductor device while elevating the temperature of each layer of said first material in said semiconductor device.

8. The process of claim 1, wherein said anisotropic etching includes the use of electro cyclotron resonance, magnetically confined reactor, magnetron dry etcher, plasma etching, reactive ion etching, point plasma etching, or magnetically confined plasma etch patterning of the semiconductor device.

9. The process of claim 1, which further includes means connected to said foraminous member for applying at least one of RF power and electrical bias to said foraminous member.

10. The process of claim 1, wherein said foraminous member comprises a plasma electrode defining at least one opening for introducing said heat through said foraminous member.

11. The process of claim 1, wherein said foraminous member comprises a mesh or grid-like plasma electrode plate.

12. A process for etching a semiconductor device to form a etched pattern therein, comprising:
providing an etching area and a foraminous member located within said etching area for supporting said semiconductor device;
supporting said semiconductor device on said foraminous member, said semiconductor device having a plurality of layers at least one of said layers comprising a layer formed of a first material which does not form volatile gaseous by-products by a chemical reaction;
elevating the temperature of each said layers formed of a first material, to a level which, upon reaction with said chemical etchant material in a gas phase which emits volatile gaseous by-products from said chemical reaction by introducing heat through said foraminous member to said semiconductor device;
anisotropically etching said semiconductor device with said etchant material to form a pattern therein, said non-reactive layer undergoing said chemical reaction thereby producing volatile gaseous by-products; and
removing said volatile gaseous by-products from said etching area;
said first material comprises a metal; and
said metal-containing material comprises copper.

13. The process of claim 12, wherein said elevated temperature is at least 300 degrees C.

14. The process of claim 12, wherein said anisotropic etching includes the use of magnetically confined reactor, magnetron dry etcher, electron cyclotron resonance, plasma etching, reactive ion, point plasma etching, or magnetically confined plasma etch patterning of the semiconductor device.

15. The process of claim 12, which further includes means connected to said foraminous member for applying at least one of RF power and electrical bias to said foraminous member.

16. The process of claim 12, wherein said elevation of the temperature of said semiconductor device comprises heating one side of said semiconductor device.

17. The process of claim 12, which further includes means for positioning said semiconductors device in an etching work area and wherein said means for elevating the temperature of said semiconductor device comprise means for heating the underside of said semiconductor device.

18. The process of claim 12, wherein said means for supporting said semiconductor device within said etching work area comprises a foraminous member.

19. The process of claim 18, wherein said foraminous member is located above said means for elevating the temperature of said semiconductor device, and the temperature of said semiconductor device is elevated by introducing heat from said means for elevating the temperature of said semiconductor device through said foraminous member to said semiconductor device.

20. The process of claim 18, wherein said foraminous member comprises a plasma electrode defining at least one opening for introducing said heat through said foraminous member.

21. The process of claim 12, wherein said foraminous member comprises a mesh or grid-like plasma electrode plate.

22. The process of claim 12, which further includes the step of applying at least one of RF power and electrical bias to the semiconductor device while elevating the temperature of each layer of said first material in said semiconductor devices.

23. The process of claim 1, wherein said elevation of the temperature of said semiconductor device comprises heating one side of said semiconductor device.

* * * * *